(12) United States Patent
Kim et al.

(10) Patent No.: US 10,523,363 B2
(45) Date of Patent: Dec. 31, 2019

(54) TRANSMISSION METHOD AND PROCESSING METHOD FOR BITSTREAM IN WIRELESS COMMUNICATION SYSTEM

(71) Applicant: LG ELECTRONICS INC., Seoul (KR)

(72) Inventors: Seonwook Kim, Seoul (KR); Joonkui Ahn, Seoul (KR); Suckchel Yang, Seoul (KR); Kijun Kim, Seoul (KR); Jonghyun Park, Seoul (KR); Daesung Hwang, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 15/749,987

(22) PCT Filed: Jul. 29, 2016

(86) PCT No.: PCT/KR2016/008368
§ 371 (c)(1),
(2) Date: Feb. 2, 2018

(87) PCT Pub. No.: WO2017/023038
PCT Pub. Date: Feb. 9, 2017

(65) Prior Publication Data
US 2018/0270025 A1 Sep. 20, 2018

Related U.S. Application Data

(60) Provisional application No. 62/200,621, filed on Aug. 3, 2015.

(51) Int. Cl.
*H04L 1/00* (2006.01)
*H04L 5/00* (2006.01)
(Continued)

(52) U.S. Cl.
CPC .......... *H04L 1/0042* (2013.01); *H03M 13/09* (2013.01); *H03M 13/098* (2013.01);
(Continued)

(58) Field of Classification Search
CPC ... H04L 1/0042; H04L 5/0053; H04W 72/042
See application file for complete search history.

(56) References Cited

U.S. PATENT DOCUMENTS 4,785,452 A * 11/1988 Petz .................. G06F 11/1008
714/756
5,881,073 A 3/1999 Wan et al.
(Continued)

*Primary Examiner* — Joseph D Torres
(74) *Attorney, Agent, or Firm* — Dentons US LLP

(57) ABSTRACT

Disclosed are: a transmission method for receiving an input bit for data to be transmitted to a reception end, determining a position of a parity bit according to a value indicated by additional information to be transmitted together with the data, and transmitting a bitstream by encoding the input bit and the parity bit according to the position of the parity bit; and a processing method for decoding the bitstream by taking into consideration of a position at which the parity bit is added to the input bit in the bitstream received from a transmission end, and acquiring the additional information transmitted together with the data indicated by the input bit according to the decoded result.

5 Claims, 12 Drawing Sheets

(51) Int. Cl.
  *H04W 72/04* (2009.01)
  *H04W 76/27* (2018.01)
  *H03M 13/09* (2006.01)
  *H04L 1/18* (2006.01)

(52) U.S. Cl.
  CPC .......... *H04L 1/0061* (2013.01); *H04L 1/1861* (2013.01); *H04L 5/0053* (2013.01); *H04L 5/0055* (2013.01); *H04W 72/042* (2013.01); *H04W 76/27* (2018.02)

(56) References Cited

U.S. PATENT DOCUMENTS

| | | | |
|---|---|---|---|
| 6,437,714 B1* | 8/2002 | Kim | H03M 13/23 341/81 |
| 2006/0159183 A1* | 7/2006 | Gaddam | H04N 21/2383 375/240.26 |
| 2006/0190801 A1* | 8/2006 | Shin | H03M 13/1197 714/758 |
| 2007/0089044 A1 | 4/2007 | Goma et al. | |
| 2007/0168844 A1* | 7/2007 | Jeong | H03M 13/2972 714/792 |
| 2008/0215953 A1* | 9/2008 | Deierling | H03M 13/17 714/759 |
| 2009/0180435 A1* | 7/2009 | Sarkar | H04L 5/14 370/330 |
| 2009/0193323 A1 | 7/2009 | Park et al. | |
| 2009/0210769 A1 | 8/2009 | Casper et al. | |
| 2010/0251057 A1* | 9/2010 | Hoshino | H04L 1/0048 714/749 |
| 2011/0084859 A1* | 4/2011 | Nakagawa | G11B 20/10351 341/67 |
| 2011/0214037 A1* | 9/2011 | Okamura | H03M 13/116 714/777 |
| 2014/0304574 A1 | 10/2014 | Seo et al. | |
| 2016/0094311 A1* | 3/2016 | Su | G06F 11/10 714/776 |

* cited by examiner

FIG. 2
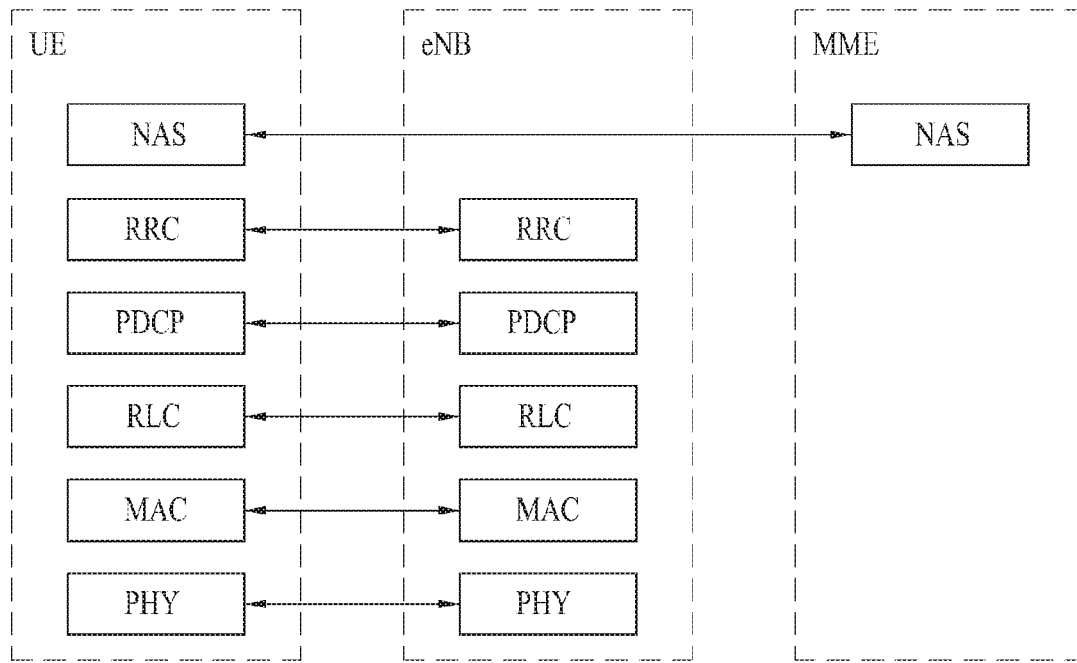
(a) control-plane protocol stack
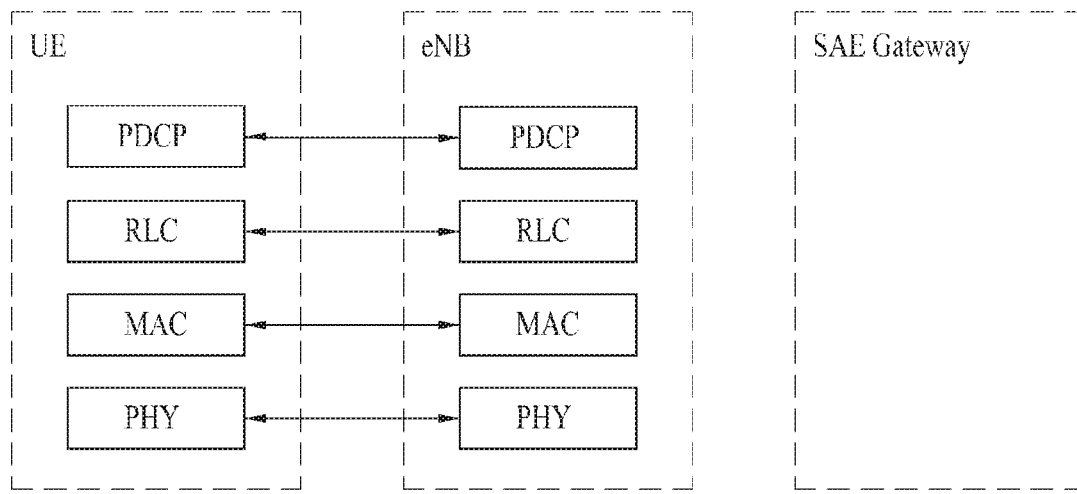
(b) user-plane protocol stack

TRANSMISSION METHOD AND PROCESSING METHOD FOR BITSTREAM IN WIRELESS COMMUNICATION SYSTEM

This application is a 35 USC § 371 National Stage entry of International Application No. PCT/KR2016/008368, filed on Jul. 26, 2016, and claims priority to U.S. Provisional Application No. 62/200,621, filed Aug. 3, 2015, all of which are incorporated by reference in their entirety herein.

TECHNICAL FIELD

Following description relates to a wireless communication system, and more particularly, to a method of transmitting a bit stream using a parity bit, a method of processing a bit stream, and a transmitting end/receiving end transmitting/receiving a bit stream.

BACKGROUND ART

A 3rd generation partnership project long term evolution (3GPP LTE) (hereinafter, referred to as 'LTE') communication system which is an example of a wireless communication system to which the present invention can be applied will be described in brief.

FIG. 1 is a diagram illustrating a network structure of an Evolved Universal Mobile Telecommunications System (E-UMTS) which is an example of a wireless communication system. The E-UMTS is an evolved version of the conventional UMTS, and its basic standardization is in progress under the 3rd Generation Partnership Project (3GPP). The E-UMTS may be referred to as a Long Term Evolution (LTE) system or LTE-Advnaced (LTE-A) system. Details of the technical specifications of the UMTS and E-UMTS may be understood with reference to Release 7 to Release 13 of "3rd Generation Partnership Project; Technical Specification Group Radio Access Network".

Referring to FIG. 1, the E-UMTS includes a User Equipment (UE), base stations (eNode B; eNB), and an Access Gateway (AG) which is located at an end of a network (E-UTRAN) and connected to an external network. The base stations may simultaneously transmit multiple data streams for a broadcast service, a multicast service and/or a unicast service.

One or more cells exist for one base station. One cell is set to one of bandwidths of 1.44, 3, 5, 10, 15 and 20 MHz to provide a downlink or uplink transport service to user equipment. Different cells may be set to provide different bandwidths. Also, one base station controls data transmission and reception for a plurality of user equipments. The base station transmits downlink (DL) scheduling information of downlink data to the corresponding user equipment to notify the corresponding user equipment of time and frequency domains to which data will be transmitted and information related to encoding, data size, and hybrid automatic repeat and request (HARQ). Also, the base station transmits uplink (UL) scheduling information of uplink data to the corresponding user equipment to notify the corresponding user equipment of time and frequency domains that can be used by the corresponding user equipment, and information related to encoding, data size, and HARQ. An interface for transmitting user traffic or control traffic may be used between the base stations. A Core Network (CN) may include the AG and a network node or the like for user registration of the user equipment. The AG manages mobility of the user equipment on a Tracking Area (TA) basis, wherein one TA includes a plurality of cells.

Although the wireless communication technology developed based on WCDMA has been evolved into LTE-A, request and expectation of users and providers have continued to increase. Also, since another wireless access technology is being continuously developed, new evolution of the wireless communication technology will be required for competitiveness in the future. In this respect, reduction of cost per bit, increase of available service, use of adaptable frequency band, simple structure and open type interface, proper power consumption of the user equipment, etc. are required.

DISCLOSURE OF THE INVENTION

Technical Tasks

An object of the present invention is to propose a mechanism for enhancing an encoding process and a decoding process to be performed on a bit stream in a wireless communication system.

Another object of the present invention is to forward additional information to a receiving end without bit allocation by improving a scheme of adding a parity bit.

The other object of the present invention is to solve an ambiguity problem capable of being occurred in a bit stream decoding process according to an enhanced scheme.

The technical problems solved by the present invention are not limited to the above technical problems and other technical problems which are not described herein will become apparent to those skilled in the art from the following description.

Technical Solution

To achieve these and other advantages and in accordance with the purpose of the present invention, as embodied and broadly described, according to one embodiment, a method of transmitting a bit stream, which is transmitted by a transmitting end to a receiving end in a wireless communication system, includes the steps of receiving an input bit for data to be transmitted to the receiving end, determining a position of a parity bit to be attached to the input bit according to a value indicated by additional information to be transmitted to the receiving end together with the data, encoding the input bit and the parity bit according to the determined position, and transmitting a bit stream generated by being encoded to the receiving end.

If the value indicated by the additional information corresponds to 0, the determined position may correspond to the back of the input bit. If the value indicated by the additional information corresponds to 1, the determined position may correspond to the front of the input bit.

The N number of the input bit satisfies a condition that $(D^{N+L}+1)$ is not divided by $g(D)$, the $g(D)$ corresponds to a cyclic generator polynomial for the parity bit, $D^{N+L}$ corresponds to a polynomial component of Galois field (GF) (2), and L may correspond to the number of the parity bit.

If the N number of the input bit does not satisfy the condition, the encoding step can perform encoding by padding a predetermined bit to the input bit.

All of the first L number of bits among the N number of the input bit do not correspond to 0, the L corresponds to the number of the parity bit, and N>L is satisfied.

The transmitting end corresponds to a base station, the receiving end corresponds to a user equipment, and the data may correspond to a DCI (downlink control indicator).

The transmitting end corresponds to a user equipment, the receiving end corresponds to a base station, and the data may correspond to a UCI (uplink control indicator).

To further achieve these and other advantages and in accordance with the purpose of the present invention, according to a different embodiment, a method of processing a bit stream, which is received from a transmitting end and is processed by a receiving end in a wireless communication system, includes the steps of receiving a bit stream from the transmitting end, decoding the bit stream in consideration of a position of an input bit to which a parity bit is attached, and acquiring additional information transmitted together with data indicated by the input bit based on the decoding result.

The decoding step includes the steps of decoding the bit stream by determining that the parity bit is attached to the back of the input bit, and decoding the bit stream by determining that the parity bit is attached to the front of the input bit and moving a partial bit positioned at the front side of the bit stream to the back.

If decoding is successfully performed by determining that the parity bit is attached to the back of the input bit, the acquiring step recognizes the additional information as 0 and if decoding is successfully performed by determining that the parity bit is attached to the front of the input bit, the acquiring step recognizes the additional information as 1.

If the decoding performed on the two cases is successfully performed, the receiving end determines the additional information by 0 or 1.

To further achieve these and other advantages and in accordance with the purpose of the present invention, according to a further different embodiment, a transmitting end transmitting a bit stream to a receiving end in a wireless communication system includes a transmitter, a receiver, and a processor configured to operate in a manner of being connected with the transmitter and the receiver, the processor configured to receive an input bit for data to be transmitted to the receiving end, the processor configured to determining a position of a parity bit to be attached to the input bit according to a value indicated by additional information to be transmitted to the receiving end together with the data, the processor configured to encode the input bit and the parity bit according to the determined position, the processor configured to transmit a bit stream generated by being encoded to the receiving end.

To further achieve these and other advantages and in accordance with the purpose of the present invention, according to a further different embodiment, a receiving end processing a bit stream received from a transmitting end in a wireless includes a transmitter, a receiver, and a processor configured to operate in a manner of being connected with the transmitter and the receiver, the processor configured to receive a bit stream from the transmitting end, the processor configured to decode the bit stream in consideration of a position of an input bit to which a parity bit is attached, the processor configured to acquire additional information transmitted together with data indicated by the input bit based on the decoding result.

Advantageous Effects

As is apparent from the above description, the embodiments of the present invention have the following effects.

First of all, since a bit stream encoding/decoding process is enhanced in a wireless communication system, it is able to efficiently transmit information.

Second, since it is able to transmit additional information to a receiving end without bit allocation, it is able to improve communication efficiency.

Third, since it is able to prevent an ambiguity problem using an enhanced scheme, it is able to perform stable communication.

The effects of the present invention are not limited to the above-described effects and other effects which are not described herein may be derived by those skilled in the art from the following description of the embodiments of the present invention. That is, effects which are not intended by the present invention may be derived by those skilled in the art from the embodiments of the present invention.

DESCRIPTION OF DRAWINGS

The accompanying drawings, which are included to provide a further understanding of the invention, illustrate embodiments of the invention and together with the description serve to explain the principle of the invention. The technical features of the present invention are not limited to specific drawings and the features shown in the drawings are combined to construct a new embodiment. Reference numerals of the drawings mean structural elements.

FIG. 2 is a diagram illustrating structures of a control plane and a user plane of a radio interface protocol between a user equipment and E-UTRAN based on the 3GPP radio access network standard;

BEST MODE

Mode for Invention

Figure 1:
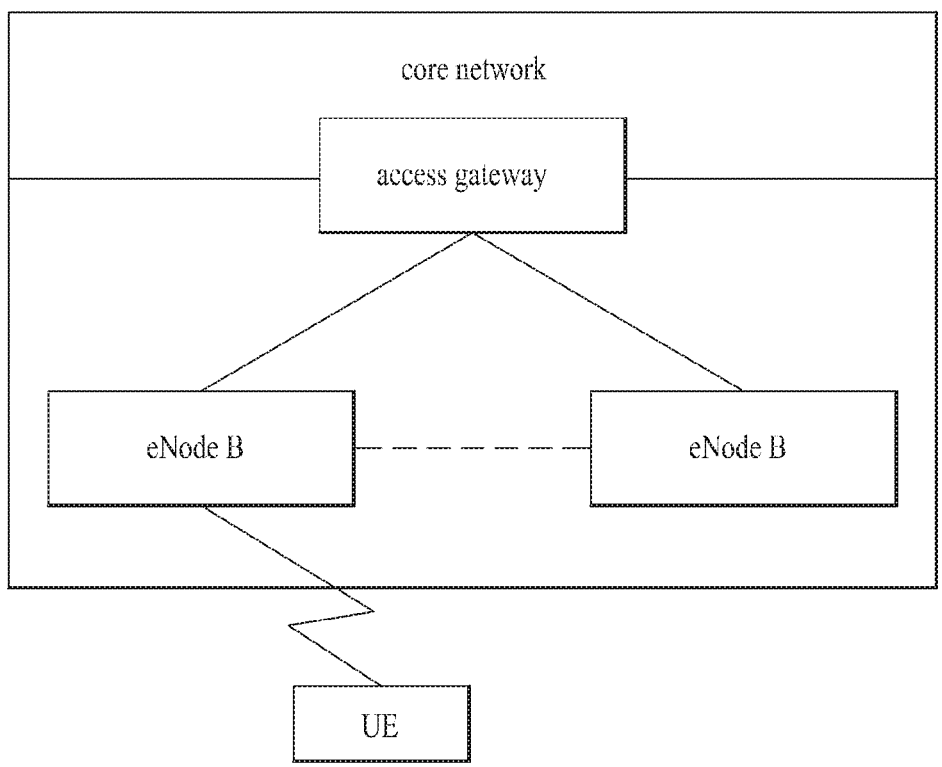
FIG. 1 is a diagram illustrating a network structure of an Evolved Universal Mobile Telecommunications System (E-UMTS) which is an example of a wireless communication system.

Although the terms used in the present invention are selected from generally known and used terms, terms used herein may be varied depending on operator's intention or customs in the art, appearance of new technology, or the like. In addition, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meanings of each term lying within.

The following embodiments are proposed by combining constituent components and characteristics of the present invention according to a predetermined format. The individual constituent components or characteristics should be considered optional factors on the condition that there is no additional remark. If required, the individual constituent components or characteristics may not be combined with other components or characteristics. In addition, some constituent components and/or characteristics may be combined to implement the embodiments of the present invention. The order of operations to be disclosed in the embodiments of the present invention may be changed. Some components or characteristics of any embodiment may also be included in other embodiments, or may be replaced with those of the other embodiments as necessary.

In describing the present invention, if it is determined that the detailed description of a related known function or construction renders the scope of the present invention unnecessarily ambiguous, the detailed description thereof will be omitted.

In the entire specification, when a certain portion "comprises or includes" a certain component, this indicates that the other components are not excluded and may be further included unless specially described otherwise. The terms "unit", "-order" and "module" described in the specification indicate a unit for processing at least one function or operation, which may be implemented by hardware, software or a combination thereof. The words "a or an", "one", "the" and words related thereto may be used to include both a singular expression and a plural expression unless the context describing the present invention (particularly, the context of the following claims) clearly indicates otherwise.

The embodiments of the present invention can be supported by the standard documents disclosed in any one of wireless access systems, such as an IEEE 802.xx system, a 3rd Generation Partnership Project (3GPP) system, a 3GPP Long Term Evolution (LTE)/LTE-Advanced (LTE-A) system, and a 3GPP2 system. That is, the steps or portions, which are not described in order to make the technical spirit of the present invention clear, may be supported by the above documents.

In addition, all the terms disclosed in the present document may be described by the above standard documents. In particular, the embodiments of the present invention may be supported by at least one of P802.16e-2004, P802.16e-2005, P802.16.1, P802.16p and P802.16.1b documents, which are the standard documents of the IEEE 802.16 system.

Hereinafter, the preferred embodiments of the present invention will be described with reference to the accompanying drawings. It is to be understood that the detailed description which will be disclosed along with the accompanying drawings is intended to describe the exemplary embodiments of the present invention, and is not intended to describe a unique embodiment which the present invention can be carried out.

It should be noted that specific terms disclosed in the present invention are proposed for convenience of description and better understanding of the present invention, and the use of these specific terms may be changed to another format within the technical scope or spirit of the present invention.

1. Generals of LTE/LTE-A System

FIG. 2 is a diagram illustrating structures of a control plane and a user plane of a radio interface protocol between a user equipment and E-UTRAN based on the 3GPP radio access network standard. The control plane means a passageway where control messages are transmitted, wherein the control messages are used by the user equipment and the network to manage call. The user plane means a passageway where data generated in an application layer, for example, voice data or Internet packet data are transmitted.

A physical layer as the first layer provides an information transfer service to an upper layer using a physical channel. The physical layer is connected to a medium access control (MAC) layer via a transport channel, wherein the medium access control layer is located above the physical layer. Data are transferred between the medium access control layer and the physical layer via the transport channel. Data are transferred between one physical layer of a transmitting side and the other physical layer of a receiving side via the physical channel. The physical channel uses time and frequency as radio resources. In more detail, the physical channel is modulated in accordance with an orthogonal frequency division multiple access (OFDMA) scheme in a downlink, and is modulated in accordance with a single carrier frequency division multiple access (SC-FDMA) scheme in an uplink.

A medium access control (MAC) layer of the second layer provides a service to a radio link control (RLC) layer above the MAC layer via a logical channel. The RLC layer of the second layer supports reliable data transmission. The RLC layer may be implemented as a functional block inside the MAC layer. In order to effectively transmit data using IP packets such as IPv4 or IPv6 within a radio interface having a narrow bandwidth, a packet data convergence protocol (PDCP) layer of the second layer performs header compression to reduce the size of unnecessary control information.

A radio resource control (RRC) layer located on the lowest part of the third layer is defined in the control plane only. The RRC layer is associated with configuration, re-configuration and release of radio bearers ('RBs') to be in charge of controlling the logical, transport and physical channels. In this case, the RB means a service provided by the second layer for the data transfer between the user equipment and the network. To this end, the RRC layers of the user equipment and the network exchange RRC message with each other. If the RRC layer of the user equipment is RRC connected with the RRC layer of the network, the user equipment is in an RRC connected mode. If not so, the user equipment is in an RRC idle mode. A non-access stratum (NAS) layer located above the RRC layer performs functions such as session management and mobility management.

One cell constituting a base station eNB is set to one of bandwidths of 1.4, 3.5, 5, 10, 15, and 20 MHz and provides a downlink or uplink transmission service to several user equipments. At this time, different cells may be set to provide different bandwidths.

As downlink transport channels carrying data from the network to the user equipment, there are provided a broadcast channel (BCH) carrying system information, a paging channel (PCH) carrying paging message, and a downlink shared channel (SCH) carrying user traffic or control messages. Traffic or control messages of a downlink multicast or broadcast service may be transmitted via the downlink SCH or an additional downlink multicast channel (MCH). Meanwhile, as uplink transport channels carrying data from the user equipment to the network, there are provided a random access channel (RACH) carrying an initial control message and an uplink shared channel (UL-SCH) carrying user traffic or control message. As logical channels located above the transport channels and mapped with the transport channels, there are provided a broadcast control channel (BCCH), a paging control channel (PCCH), a common control channel (CCCH), a multicast control channel (MCCH), and a multicast traffic channel (MTCH).

Figure 3:
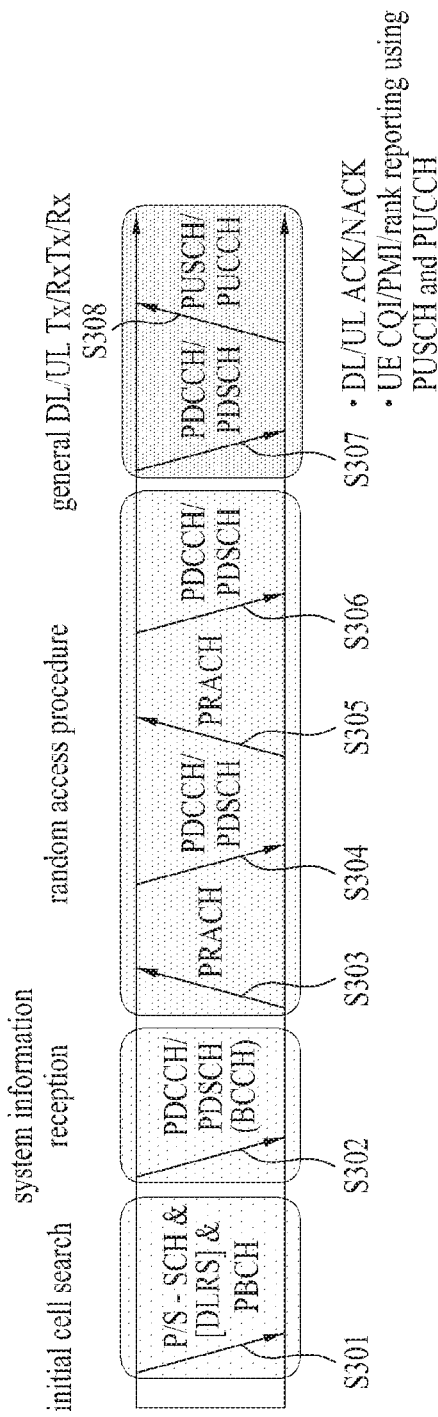
FIG. 3 is a diagram illustrating physical channels used in a 3GPP LTE system and a general method for transmitting a signal using the physical channels.

FIG. 3 is a diagram illustrating physical channels used in a 3GPP LTE/LTE-A system and a general method for transmitting a signal using the physical channels.

The user equipment performs initial cell search such as synchronizing with the base station when it newly enters a cell or the power is turned on at step S301. To this end, the user equipment synchronizes with the base station by receiving a primary synchronization channel (P-SCH) and a secondary synchronization channel (S-SCH) from the base station, and acquires information such as cell ID, etc. Afterwards, the user equipment may acquire broadcast information within the cell by receiving a physical broadcast channel (PBCH) from the base station. Meanwhile, the user equipment may identify a downlink channel status by receiving a downlink reference signal (DL RS) at the initial cell search step.

The user equipment which has finished the initial cell search may acquire more detailed system information by receiving a physical downlink shared channel (PDSCH) in accordance with a physical downlink control channel (PDCCH) and information carried in the PDCCH at step S302.

Afterwards, the user equipment may perform a random access procedure (RACH) such as steps S303 to S306 to complete access to the base station. To this end, the user equipment may transmit a preamble through a physical random access channel (PRACH) (S303), and may receive a response message to the preamble through the PDCCH and the PDSCH corresponding to the PDCCH (S304). In case of a contention based RACH, the user equipment may perform a contention resolution procedure such as transmission (S305) of additional physical random access channel and reception (S306) of the physical downlink control channel and the physical downlink shared channel corresponding to the physical downlink control channel.

The user equipment which has performed the aforementioned steps may receive the physical downlink control channel (PDCCH)/physical downlink shared channel (PDSCH) (S307) and transmit a physical uplink shared channel (PUSCH) and a physical uplink control channel (PUCCH) (S308), as a general procedure of transmitting uplink/downlink signals. Control information transmitted from the user equipment to the base station will be referred to as uplink control information (UCI). The UCI includes HARQ ACK/NACK (Hybrid Automatic Repeat and reQuest Acknowledgement/Negative-ACK), SR (Scheduling Request), CSI (Channel State Information), etc. In this specification, the HARQ ACK/NACK will be referred to as HARQ-ACK or ACK/NACK (A/N). The HARQ-ACK includes at least one of positive ACK (simply, referred to as ACK), negative ACK (NACK), DTX and NACK/DTX. The CSI includes CQI (Channel Quality Indicator), PMI (Precoding Matrix Indicator), RI (Rank Indication), etc. Although the UCI is generally transmitted through the PUCCH, it may be transmitted through the PUSCH if control information and traffic data should be transmitted at the same time. Also, the user equipment may non-periodically transmit the UCI through the PUSCH in accordance with request/command of the network.

Figure 4:
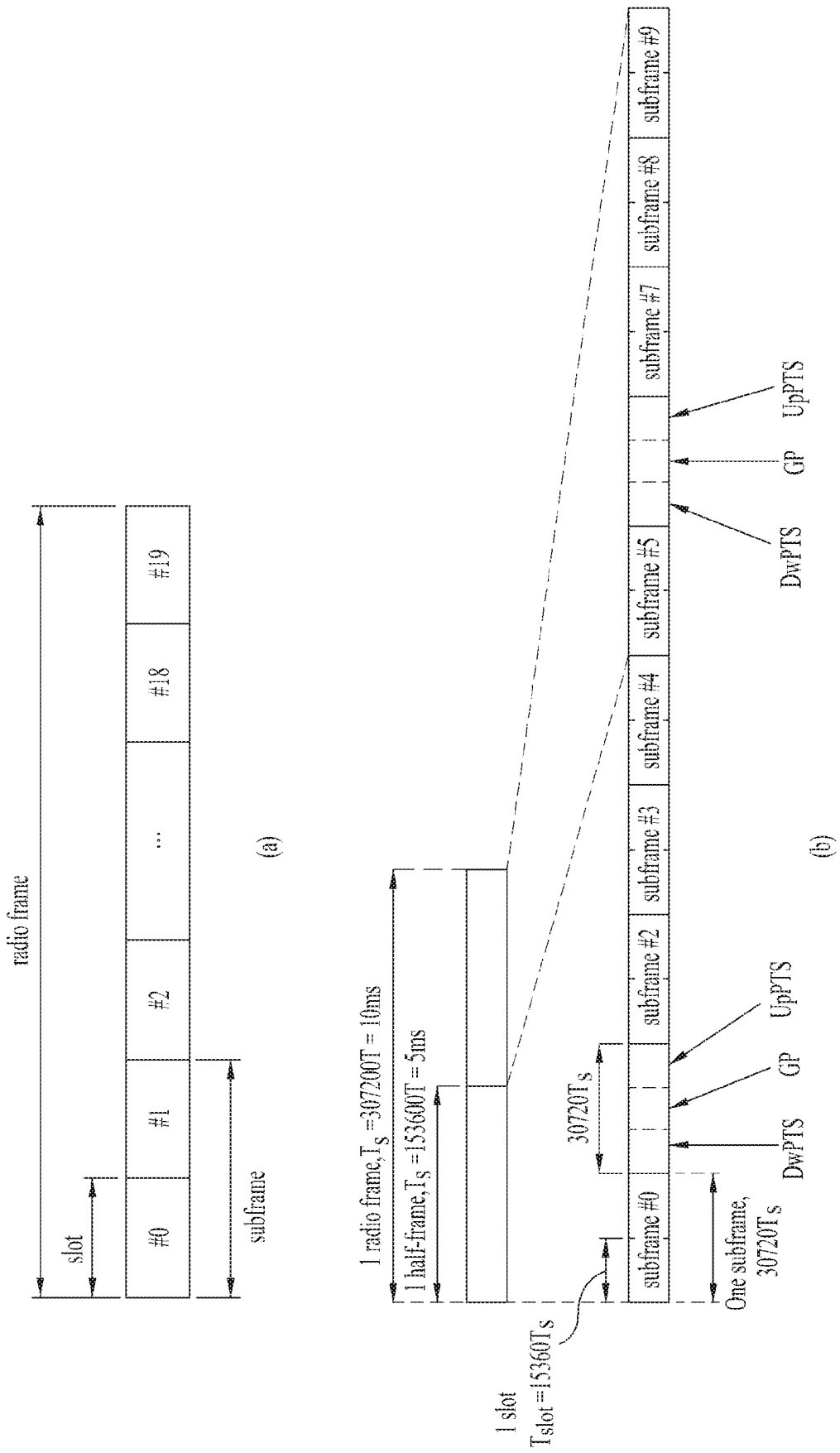
FIG. 4 is a diagram showing the structure of a radio frame used in a LTE/LTE-A system.

FIG. 4 is a diagram showing the structure of a radio frame used in a LTE/LTE-A system.

Referring to FIG. 4, in a cellular Orthogonal Frequency Division Multiplexing (OFDM) wireless packet communication system, uplink and/or downlink data packets are transmitted in subframes. One subframe is defined as a predetermined time period including a plurality of OFDM symbols. The 3GPP LTE standard supports a type-1 radio frame structure applicable to Frequency Division Duplex (FDD) and a type-2 radio frame structure applicable to Time Division Duplex (TDD).

FIG. 4(a) illustrates the type-1 radio frame structure. A downlink radio frame is divided into 10 subframes. Each subframe is further divided into two slots in the time domain. A unit time during which one subframe is transmitted is defined as a Transmission Time Interval (TTI). For example, one subframe may be 1 ms in duration and one slot may be 0.5 ms in duration. A slot includes a plurality of OFDM symbols in the time domain and a plurality of Resource Blocks (RBs) in the frequency domain. Because the 3GPP LTE system adopts OFDMA for downlink, an OFDM symbol represents one symbol period. An OFDM symbol may be referred to as an SC-FDMA symbol or symbol period. An RB is a resource allocation unit including a plurality of contiguous subcarriers in a slot.

The number of OFDM symbols in one slot may vary depending on a Cyclic Prefix (CP) configuration. There are two types of CPs: extended CP and normal CP. In the case of the normal CP, one slot includes 7 OFDM symbols. In the case of the extended CP, the length of one OFDM symbol is increased and thus the number of OFDM symbols in a slot is smaller than in the case of the normal CP. Thus when the extended CP is used, for example, 6 OFDM symbols may be included in one slot. If channel state gets poor, for example, during fast movement of a UE, the extended CP may be used to further decrease Inter-Symbol Interference (ISI).

In the case of the normal CP, one subframe includes 14 OFDM symbols because one slot includes 7 OFDM symbols. The first two or three OFDM symbols of each subframe may be allocated to a Physical Downlink Control Channel (PDCCH) and the other OFDM symbols may be allocated to a Physical Downlink Shared Channel (PDSCH).

FIG. 4(b) illustrates the type-2 radio frame structure. A type-2 radio frame includes two half frames, each having four normal subframe including two slots and a special subframe including a Downlink Pilot Time Slot (DwPTS), a Guard Period (GP), and an Uplink Pilot Time Slot (UpPTS).

In the special subframe, the DwPTS is used for initial cell search, synchronization, or channel estimation at a UE. The UpPTS is used for channel estimation and acquisition of uplink transmission synchronization to a UE at an eNB. That is, the DwPTS is used for downlink transmission and the UpPTS is used for uplink transmission and, in particular, the UpPTS is used to transmit a PRACH preamble or an SRS. In addition, the GP is a period between an uplink and a downlink, which eliminates uplink interference caused by multipath delay of a downlink signal.

With regard to the above special subframe, the current 3GPP standard document defines configuration as shown in Table 1 below. In the case of $T_s=1/(15000\times2048)$, Table 1 below lists DwPTS and UpPTS and the remaining period is configured as the guard period.

TABLE 1

| Special subframe configuration | Normal cyclic prefix in downlink | | | Extended cyclic prefix in downlink | | |
|---|---|---|---|---|---|---|
| | DwPTS | UpPTS | | DwPTS | UpPTS | |
| | | Normal cyclic prefix in uplink | Extended cyclic prefix in uplink | | Normal cyclic prefix in uplink | Extended cyclic prefix in uplink |
| 0 | $6592 \cdot T_s$ | $2192 \cdot T_s$ | $2560 \cdot T_s$ | $7680 \cdot T_s$ | $2192 \cdot T_s$ | $2560 \cdot T_s$ |
| 1 | $19760 \cdot T_s$ | | | $20480 \cdot T_s$ | | |
| 2 | $21952 \cdot T_s$ | | | $23040 \cdot T_s$ | | |
| 3 | $24144 \cdot T_s$ | | | $25600 \cdot T_s$ | | |
| 4 | $26336 \cdot T_s$ | | | $7680 \cdot T_s$ | $4384 \cdot T_s$ | $5120 \cdot T_s$ |
| 5 | $6592 \cdot T_s$ | $4384 \cdot T_s$ | $5120 \cdot T_s$ | $20480 \cdot T_s$ | | |
| 6 | $19760 \cdot T_s$ | | | $23040 \cdot T_s$ | | |
| 7 | $21952 \cdot T_s$ | | | $12800 \cdot T_s$ | | |
| 8 | $24144 \cdot T_s$ | | | — | — | — |
| 9 | $13168 \cdot T_s$ | | | — | — | — |

The type-2 radio frame structure, that is, UL/DL configuration in the TDD system is shown in Table 2 below.

TABLE 2

| Uplink-downlink configuration | Downlink-to-Uplink Switch-point periodicity | Subframe number | | | | | | | | | |
|---|---|---|---|---|---|---|---|---|---|---|---|
| | | 0 | 1 | 2 | 3 | 4 | 5 | 6 | 7 | 8 | 9 |
| 0 | 5 ms | D | S | U | U | U | D | S | U | U | U |
| 1 | 5 ms | D | S | U | U | D | D | S | U | U | D |
| 2 | 5 ms | D | S | U | D | D | D | S | U | D | D |
| 3 | 10 ms | D | S | U | U | U | D | D | D | D | D |
| 4 | 10 ms | D | S | U | U | D | D | D | D | D | D |
| 5 | 10 ms | D | S | U | D | D | D | D | D | D | D |
| 6 | 5 ms | D | S | U | U | U | D | S | U | U | D |

In Table 2 above, D denotes a downlink subframe, U denotes an uplink subframe and S denotes a special subframe. Table 2 above also shows a downlink-uplink switching period in uplink/downlink subframe configuration in each system.

The aforementioned radio frame structure is merely an example and the number of subframes included in the radio frame, the number of slots included in the subframe, or the number of symbols included in the slot may be changed in various ways.

Figure 5:
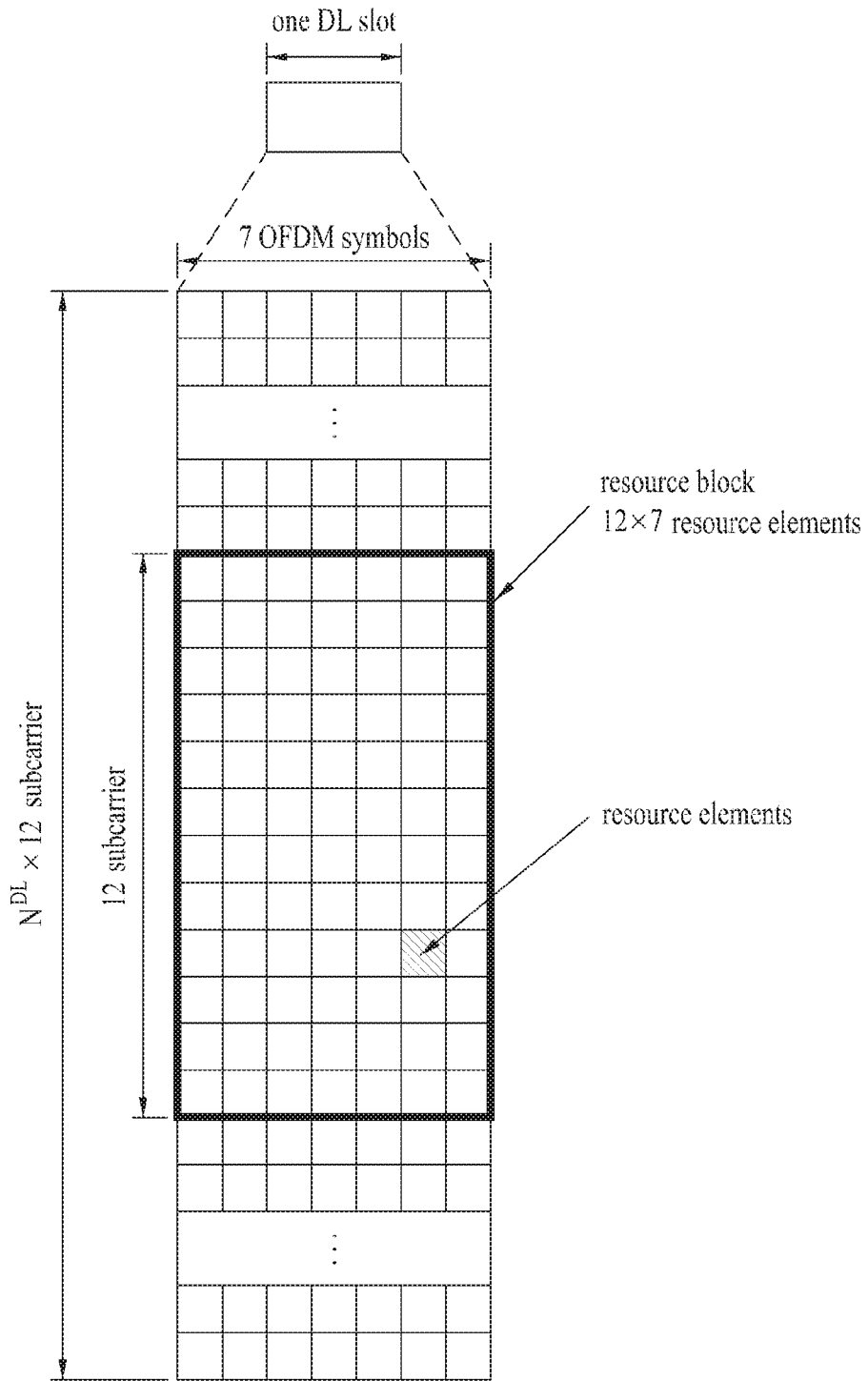
FIG. 5 is a diagram illustrating a resource grid of a downlink slot.

FIG. 5 is a diagram illustrating a resource grid of a downlink slot.

Referring to FIG. 5, the downlink slot includes a plurality of $N_{symb}^{DL}$ OFDM symbols in a time domain and a plurality of $N_{RB}^{DL}$ resource blocks in a frequency domain. Since each resource block includes $N_{sc}^{RB}$ subcarriers, the downlink slot includes $N_{RB}^{DL} \times N_{sc}^{RB}$ subcarriers in the frequency domain. Although FIG. 5 illustrates that the downlink slot includes seven OFDM symbols and the resource block includes twelve subcarriers, it is to be understood that the downlink slot and the resource block are not limited to the example of FIG. 5. For example, the number of OFDM symbols included in the downlink slot may be varied depending on the length of the CP.

Each element on the resource grid will be referred to as a resource element (RE). One resource element is indicated by one OFDM symbol index and one subcarrier index. One RB includes $N_{symb}^{DL} \times N_{sc}^{RB}$ number of resource elements. The number $N_{RB}^{DL}$ of resource blocks included in the downlink slot depends on a downlink transmission bandwidth configured in the cell.

Figure 6:
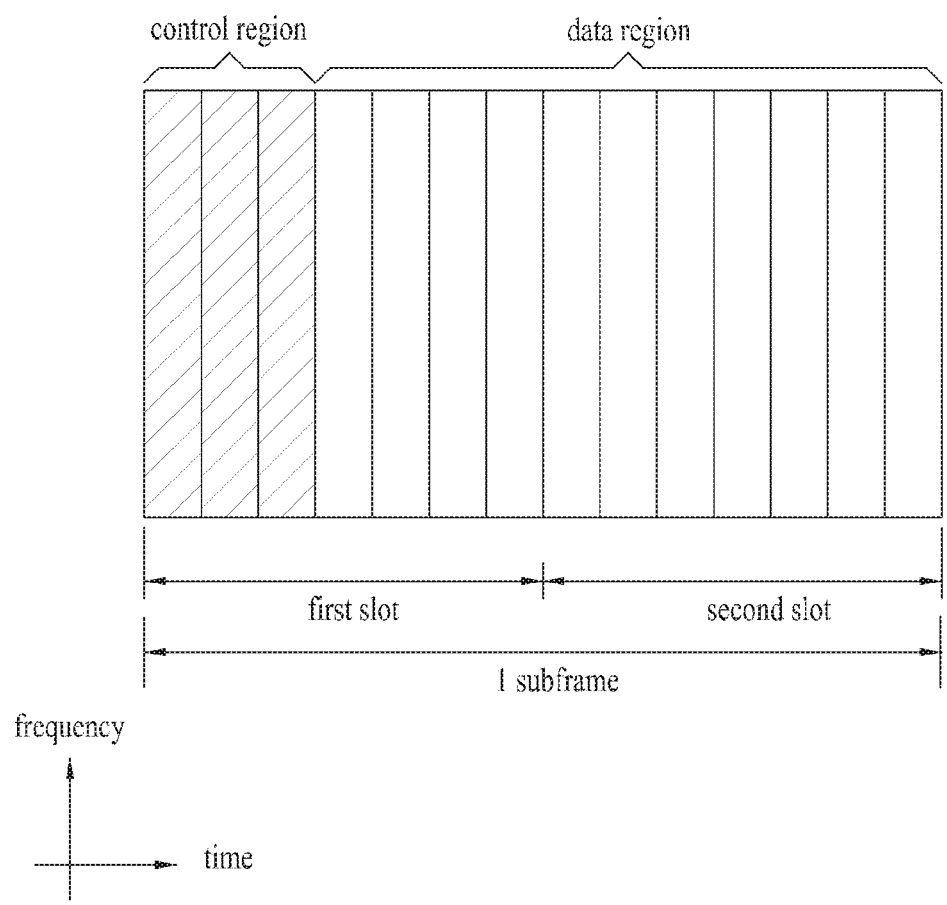
FIG. 6 illustrates the structure of a downlink subframe.

FIG. 6 illustrates the structure of a downlink subframe.

Referring to FIG. 6, up to three (four) OFDM symbols at the start of the first slot in a subframe are used for a control region to which control channels are allocated and the other OFDM symbols of the downlink subframe are used for a data region to which a Physical Downlink Shared Channel (PDSCH) is allocated. Downlink control channels used in the 3GPP LTE system include a Physical Control Format Indicator Channel (PCFICH), a Physical Downlink Control Channel (PDCCH), Physical hybrid ARQ indicator Channel (PHICH), and so on. The PCFICH is transmitted in the first OFDM symbol of a subframe, carrying information about the number of OFDM symbols used for transmission of control channels in the subframe. The PHICH delivers an HARQ ACKnowledgment/Negative ACKnowledgment (ACK/NACK) signal in response to an uplink transmission.

Control information carried on the PDCCH is called Downlink Control Information (DCI). The DCI includes resource allocation information and other control information for a UE or a UE group. For example, the DCI includes uplink/downlink scheduling information, uplink transmission (Tx) power control command, and so on.

The PDCCH delivers information about resource allocation and a transport format for a Downlink Shared Channel (DL-SCH), information about resource allocation and a transport format for an Uplink Shared Channel (UL-SCH), paging information of a Paging Channel (PCH), system information on the DL-SCH, information about resource allocation for a higher-layer control message such as a Random Access Response transmitted on the PDSCH, a set of Tx power control commands for individual UEs of a UE group, a Tx power control command, Voice Over Internet Protocol (VoIP) activation information, etc. A plurality of PDCCHs may be transmitted in the control region. A UE may monitor a plurality of PDCCHs. A PDCCH is transmitted on an aggregation of one or more contiguous Control Channel Elements (CCEs). A CCE is a logical allocation unit used to provide a PDCCH at a coding rate based on the state of a radio channel. A CCE corresponds to a plurality of resource element groups (REGs). The format of a PDCCH and the number of available bits for the PDCCH are determined according to the number of CCEs. An eNB determines the PDCCH format according to DCI transmitted to a UE and adds a Cyclic Redundancy Check (CRC) to control information. The CRC is masked by an Identifier (ID) (e.g., radio network temporary identifier (RNTI)) according to the owner or usage of the PDCCH. For example, if the PDCCH is directed to a specific UE, its CRC may be masked by an ID (e.g., cell-RNTI (C-RNTI)) of a corresponding UE. If the PDCCH is for a paging message, the CRC of the PDCCH may be masked by a paging ID (e.g., paging-RNTI (P-RNTI)). If the PDCCH is directed to system information (in more detail, system Information block (SIC)), its CRC may be masked by system Information RNTI (SI-RNTI). If the PDCCH is directed to random access response, its CRC may be masked by a Random Access-RNTI (RA-RNTI).

2. Carrier Aggregation (CA) and Cross Scheduling

Figure 7:
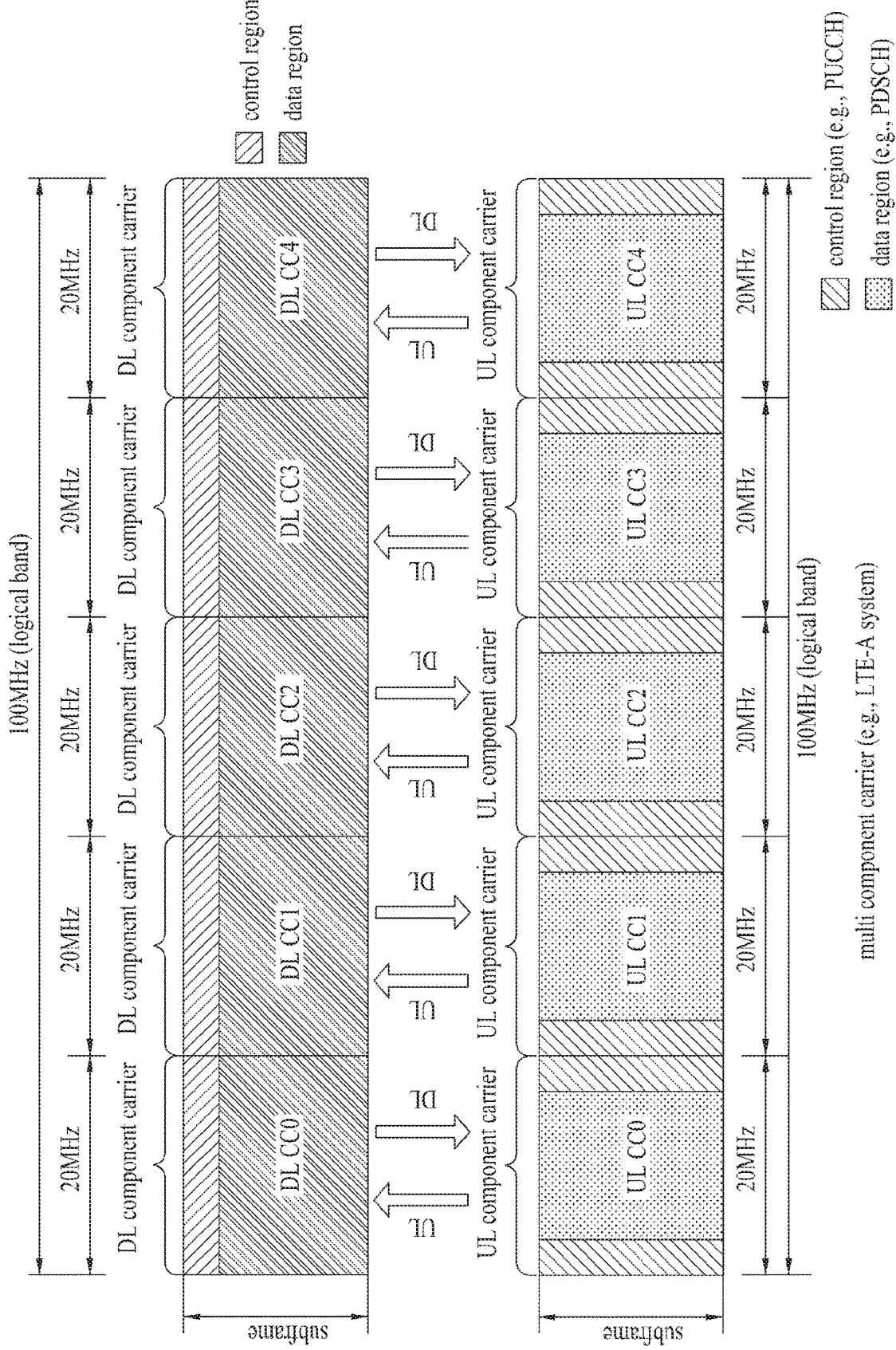
FIG. 7 is a diagram illustrating carrier aggregation related to the present invention.

FIG. 7 illustrates carrier aggregation related to the present invention.

Referring to FIG. 7, a communication system may support wider uplink/downlink bandwidths by aggregating a plurality of uplink/downlink component carriers (CCs). The term "component carrier (CC)" may be replaced by other equivalent terms (e.g., carrier, cell, spectrum and the like). CCs may be contiguous or non-continuous in the frequency domain. Bandwidths of CCs may be independently set. Asymmetrical carrier aggregation in which the number of UL CCs differs from the number of DL CCs may be possible. Control information may be configured to be transmitted and received only through a specific CC. Such specific CC may be referred to as a primary CC (or anchor CC) and other CCs may be referred to as secondary CCs.

When cross-carrier scheduling (or cross-CC scheduling) is applied, a PDCCH for downlink assignment may be transmitted on DL CC#0 and a PDSCH corresponding thereto may be transmitted on DL CC#2. For cross-CC scheduling, introduction of a carrier indicator field (CIF) may be considered. Presence or absence of the CIF in a PDCCH may be determined by higher layer signaling (e.g. RRC signaling) semi-statically and UE-specifically (or UE group-specifically). The baseline of PDCCH transmission is summarized as follows.

1) CIF disabled: a PDCCH on a DL CC is used to allocate a PDSCH resource on the same DL CC or a PUSCH resource on a linked UL CC.

1-1) No CIF 1-2) LTE PDCCH structure (resource mapping based on the same coding and same CCE)

2) CIF enabled: a PDCCH on a DL CC may be used to allocate a PDSCH or PUSCH resource on a specific DL/UL CC from among a plurality of aggregated DL/UL CCs using the CIF.

2-1) LTE DCI format extended to have the CIF 2-1-1) CIF corresponds to a fixed x-bit field (e.g. x=3) (when the CIF is set).

2-1-2) CIF position is fixed irrespective of DCI format size (when the CIF is set).

2-2) LTE PDCCH structure is reused (resource mapping based on the same coding and same CCE)

Figure 8:
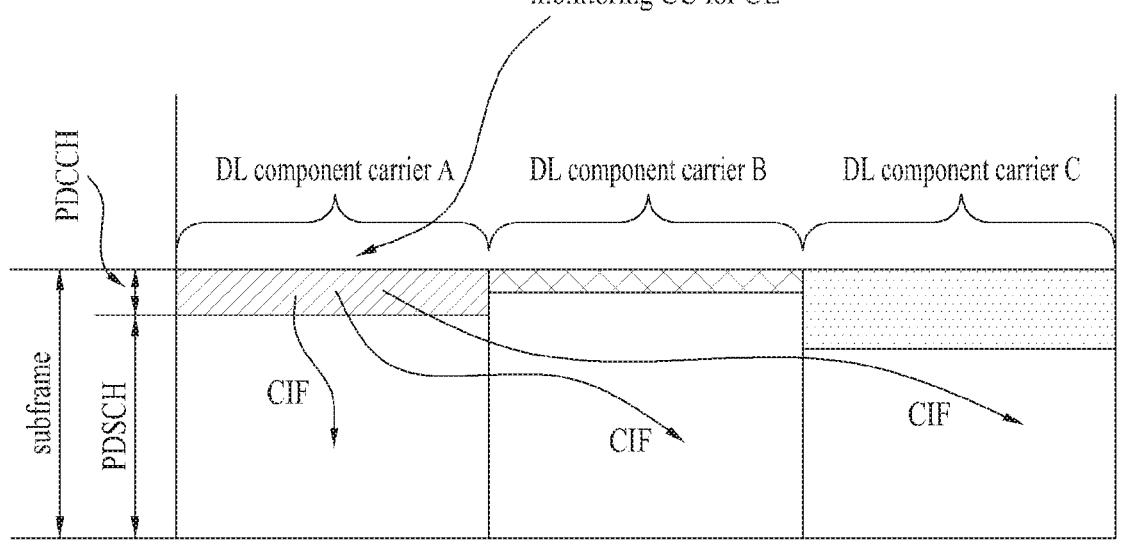
FIG. 8 is a diagram illustrating cross scheduling in the case of multi-carrier aggregation related to the present invention.

FIG. 8 is a diagram illustrating cross scheduling when a plurality of carriers is aggregated according to the present invention.

When the CIF is present, a BS may allocate a PDCCH monitoring DL CC set in order to reduce blind decoding complexity of a UE. The PDCCH monitoring DL CC set includes one or more DL CCs as part of aggregated DL CCs, and the UE performs PDCCH detection/decoding only on the corresponding DL CCs. That is, when the BS schedules a PDSCH/PUSCH for the UE, the PDCCH is transmitted only through the PDCCH monitoring DL CC set. The PDCCH monitoring DL CC set may be set UE-specifically, UE-group-specifically or cell-specifically. The term "PDCCH monitoring DL CC" may be replaced by an equivalent term such as "monitoring cell". In addition, CCs aggregated for a UE may be replaced by equivalent terms such as serving CCs, serving carriers, serving cells and the like.

As shown in FIG. 8, 3 DL CCs may be aggregated. In FIG. 8, DL CC A is set to a PDCCH monitoring DL CC. DL CC A, DL CC B and DL CC C may be called serving CCs, serving carriers, serving cells, etc. In case of CIF disabled, a DL CC can carry only a PDCCH that schedules a PDSCH corresponding to the DL CC without a CIF according to LTE PDCCH configuration. When the CIF is enabled according to UE-specific (or UE-group-specific or cell-specific) higher layer signaling, DL CC A (monitoring DL CC) may carry not only a PDCCH that schedules the PDSCH corresponding to the DL CC A but also PDCCHs that schedule PDSCHs of other DL CCs using the CIF. In this case, a PDCCH is not transmitted on DL CC B/DL CC C, which are not set to PDCCH monitoring DL CCs. Accordingly, DL CC A (monitoring DL CC) needs to include all of a PDCCH search region associated with DL CC A, a PDCCH search region associated with DL CC B and a PDCCH search space associated with DL CC C. In the specification, it is assumed that a PDCCH search region is defined per carrier.

As described above, LTE-A considers use of the CIF in a PDCCH for cross-CC scheduling. Whether the CIF is used (that is, whether the cross-CC scheduling mode or non-cross-CC scheduling mode is supported) and switching between modes may be semi-statically/UE-specifically set through RRC signaling. The UE may recognize whether the CIF is used in a PDCCH that will be scheduled for the UE after passing through RRC signaling.

3. Proposed Method for Transmitting and Receiving Data

In the following, proposed embodiments are explained with reference to FIGS. 9 to 13. In a wireless communication system, a process of transmitting data is basically performed on the premise of occurrence of an error. Hence, successfully forwarding data without an error is always accompanied with a process of detecting and correcting an error. The most common way to detect an error in a legacy communication system is to transmit an additional data to data to be transmitted and check whether or not an error occurs on the received data. For example, parity bit check sum, CRC (cyclic redundancy check), and the like are mainly used for detecting an error. Since the CRC scheme shows good detection performance and is easy to implement, the CRC scheme is utilized by many communication systems (3GPP LTE/LTE-A, IEEE 802.11 system, etc.).

In the following embodiment, a method of utilizing a CRC not only for a usage of detecting occurrence of an error but also for an additional usage is proposed. In particular, a procedure of forwarding additional information to a receiving end is explained according to a scheme of combining a CRC with data to be transmitted by a transmitting end.

First of all, a CRC scheme is explained in detail. Assume an input data $(a_0, a_1, a_2, a_3, \ldots, a_{N-1})$ consisting of N number of bits and a parity bit $(p_0, p_1, p_2, p_3, \ldots, p_{L-1})$ consisting of L number of bits corresponding to the input data. An equation 1 described in the following shows the input data and the parity bit expressed by a polynomial expression of Galois field (GF 2).

$$A(D) = a_0 D_{N-1} + a_1 D_{N-2} + \ldots + a_{N-2} D_1 + A_{N-1}$$

$$P(D) = p_0 D_{L-1} + p_1 D_{L-2} + \ldots + p_{L-2} D_1 + p_{L-1} \quad \text{[Equation 1]}$$

In equation 1, a parity bit P(D) is generated by a cyclic generator polynomial (g(D)) and the g(D) corresponds to a polynomial commonly occupied by a transmitting end and a receiving end. In particular, the g(D) is known to the transmitting end and the receiving end in advance.

Specifically, in the equation 1, the parity bit P(D) corresponds to the remainder resulted from multiplying the input bit A(D) by $D^L$ and dividing it by the g(D). The relation can be expressed by equation 2 described in the following.

$$A(D)D^L = g(D)Q(D) + P(D) \quad \text{[Equation 2]}$$

Meanwhile, the transmitting end generates a parity bit according to the equation 1 and the equation 2 and generates a bit stream "$a_0, a_1, a_2, a_3, \ldots, a_{N-1}, p_0, p_1, p_2, p_3, \ldots, p_{L-1}$" to which a CRC is added by attaching the parity bit to the input data. The generated bit stream is transmitted to the receiving end. Having received the bit stream, the receiving end divides received bits by the g(D) and checks whether or not the remainder is 0. If the remainder is 0, it means that the bit stream is received without an error. This is because it is necessary for a bit stream (the left side of equation 3) received according to the equation 3 to be divided by the g(D) (the right side of the equation 3).

$$A(D)D^L + P(D) = g(D)Q(D) \quad \text{[Equation 3]}$$

As mentioned in the foregoing description, according to a legacy CRC scheme, a parity bit is attached to the back side of an input bit to detect occurrence of an error. Yet, according to a proposed embodiment, a parity bit is attached not only to the back side but also to a front side of an input bit to generate a bit stream. Hence, a transmitting end can forward information corresponding to additional 1 bit by selectively adding a parity bit to the front side or the back side of an input bit. For example, if the transmitting end adds a parity bit to the back side of an input bit, it indicates an additional 1-bit value '0'. If the transmitting end adds a parity bit to the front side of an input bit, it indicates an additional 1-bit value '1'.

Figure 9:
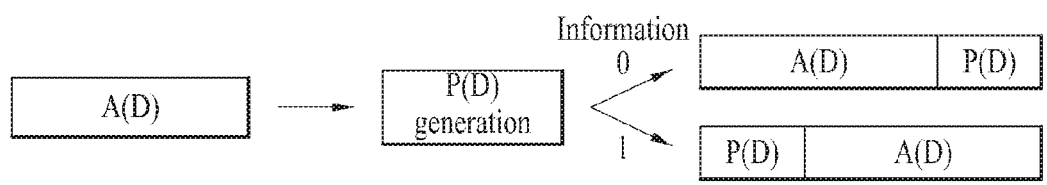
FIG. 9 is a diagram for explaining an encoding process for a method of transmitting a bit stream proposed in the present invention.

In the following, an encoding process of a transmitting end and a decoding process of a receiving end are explained with reference to FIG. 9 and FIG. 10, respectively. First of all, FIG. 9 illustrates a bit stream encoding process of a transmitting end.

A transmitting end generates a parity bit P(D) for an input data and determines whether information to be additionally transmitted corresponds to '0' or '1'. If the information to be additionally transmitted corresponds to '0', the transmitting end attaches a parity bit to the back of the input data. If the information to be additionally transmitted corresponds to '1', the transmitting end attaches a parity bit to the front of the input data. In the following, for clarity, the parity bit attached to the back of the input data is referred to as a back parity or a bCRC (backward CRC). The parity bit attached to the front of the input data is referred to as a forward parity or an fCRC (forward CRC). The transmitting end attaches the bCRC or the fCRC to the input data to generate a bit stream and transmits the generated bit stream to the receiving end.

Figure 10:
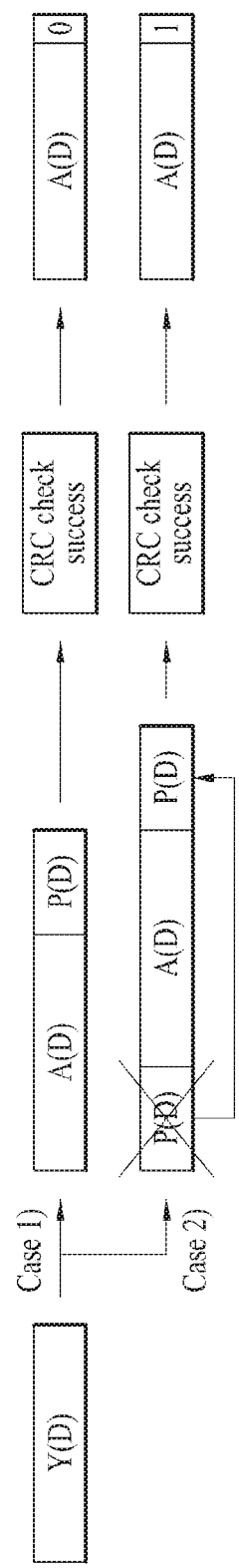
FIG. 10 is a diagram for explaining a decoding process for a method of processing a bit stream proposed in the present invention.

FIG. 10 illustrates a bit stream decoding process of a receiving end. The receiving end is unable to know whether a parity bit is attached to the front side or a back side of an input bit in a received bit stream. In particular, the receiving end is unable to know whether the parity bit corresponds to a bCRC or an fCRC. Hence, the receiving end should perform CRC check on a reception signal Y(D) in consideration of two cases (i.e., bCRC and fCRC).

First of all, as shown in the case 1) of FIG. 10, the receiving end performs CRC check under the assumption that the bCRC (i.e., parity bit) is attached to the back of an input bit. The receiving end divides a bit stream by g(D) on the premise that the parity bit is attached to the back of the input bit. If the remainder corresponds to 0, the receiving end determines it as an error does not occur. Then, the receiving end determines that the transmitting end has additionally transmitted information corresponding to '0'.

Meanwhile, as shown in the case 2) of FIG. 10, the receiving end should perform CRC check under the assumption that the fCRC (i.e., parity bit) is attached to the front of the input bit. This is because the receiving end does not know a parity bit applied to the input bit among the bCRC and the fCRC. The receiving end moves the L number of bits positioned at the front of a bit stream to the end of the bit stream on the premise that the parity bit is attached to the front of the input bit. Subsequently, the receiving end divides the modified bit stream by g(D). If the remainder corresponds to 0, the receiving end determines that the transmitting end has additionally transmitted information corresponding to '1'.

In this case, if the receiving end succeeds in performing CRC check for both of the two cases (bCRC and fCRC) (i.e., the remainder is 0 in both cases), the receiving end is unable to know whether an additionally transmitted bit corresponds to 0 or 1. In particular, an ambiguity problem occurs. In the following, a case that the ambiguity problem occurs is explained with reference to FIG. 11 and FIG. 12.

Figure 11:
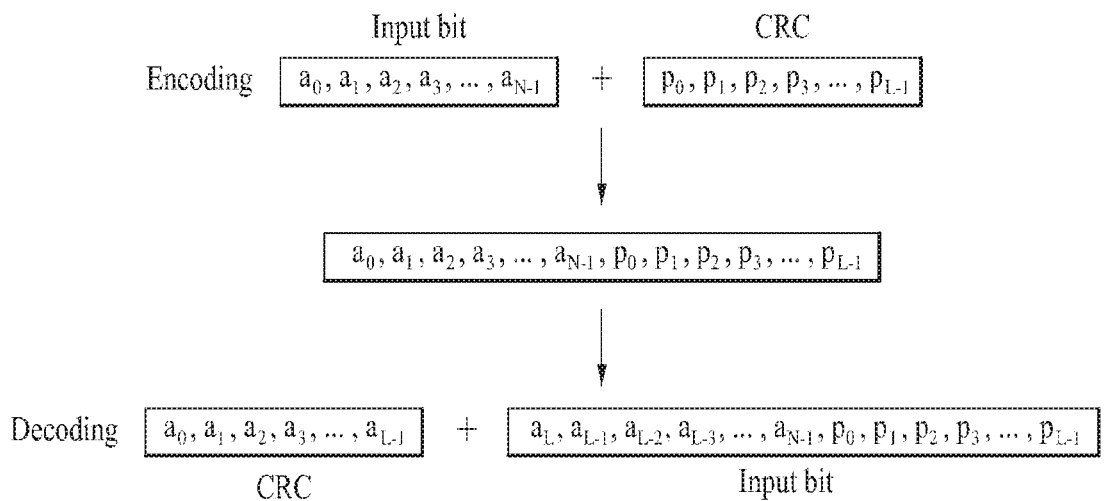
FIGS. 11 and 12 are diagrams for explaining occurrence of an ambiguity problem.

Referring to FIG. 11, although a transmitting end performs encoding using a bCRC, a receiving end succeeds in performing CRC check on the premise of an fCRC. Although the transmitting end performs encoding on a bit stream using the bCRC that a parity bit is attached to the back of an input bit, if a prescribed condition is satisfied, the receiving end can successfully decode a bit stream on the premise of the fCRC. An equation 4 in the following shows the condition.

$$\begin{aligned} a_L D^{N+L-1} + \ldots + a_{N-2} D^{2L+1} + a_{N-1} D^{2L} + p_0 D^{2L-1} + \ldots + \\ p_{L-2} D^{L+1} + p_{L-1} D^L + a_0 D^{L-1} \ldots + a_{L-2} D^1 + a_{L-1} = \\ A(D) D^L + a_0 D^{N+2L-1} \ldots + a_{L-2} D^{N+L+1} + a_{L-1} D^{N+L} + \\ a_0 D^{L-1} \ldots + a_{L-2} D^1 + a_{L-1} = g(D) Q(D) D^L + \\ (D^{N+L} + 1)(a_0 D^{L-1} \ldots + a_{L-2} D^1 + a_{L-1}) = g(D) \tilde{Q}(D) \end{aligned} \quad \text{[Equation 4]}$$

As shown in equation 4, if a term "$(D^{N+L}+1)$" is divided by g(d) or corresponds to $a_0 = a_1 = \ldots = a_{L-2} = a_{L-1} = 0$, although a receiving end performs decoding on a bit stream encoded by a transmitting end using bCRC on the premise of fCRC, the receiving end may succeed in performing CRC check. In particular, an ambiguity problem may occur. In this case, the g(D) corresponds to a cyclic generator polynomial for a parity bit, $D^{N-L}$ corresponds to a polynomial component of Galois field (GF 2), N corresponds to the number of input bits, and L corresponds to the number of parity bits.

Figure 12:
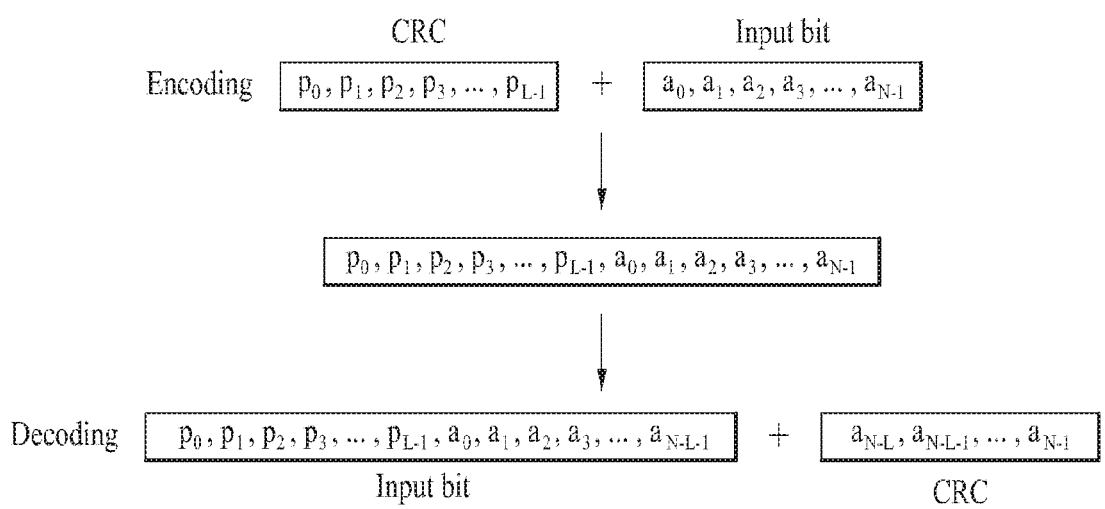

Referring to FIG. 12, although a transmitting end performs encoding using an fCRC, a receiving end succeeds in performing CRC check on the premise of a bCRC. Although the transmitting end performs encoding on a bit stream using the fCRC that a parity bit is attached to the front of an input bit, if a prescribed condition is satisfied, the receiving end can successfully decode a bit stream on the premise of the bCRC. An equation 5 in the following shows the condition.

$$(p_0 D^{L-1} + \ldots + p_{L-2} D^1 + p_{L-1}) D^N + \quad \text{[Equation 5]}$$

-continued $$a_0 D^{N-1} + a_1 D^{N-2} + \ldots + a_{N-2} D^1 + a_{N-1} =$$
$$\{A(D) + (a_0 D^{N-1} + a_1 D^{N-2} + \ldots + a_{N-2} D^1 + a_{N-1})D^L\}$$
$$D^N + a_0 D^{N-1} + a_1 D^{N-2} + \ldots + a_{N-2} D^1 + a_{N-1} =$$
$$A(D)D^N + (a_0 D^{N-1} + a_1 D^{N-2} + \ldots + a_{N-2} D^1 + a_{N-1})$$
$$D^{N+L} + a_0 D^{N-1} + a_1 D^{N-2} + \ldots + a_{N-2} D^1 + a_{N-1} =$$
$$g(D)Q(D)D^N + (D^{N+L}+1)(a_0 D^{N-1} + a_1 D^{N-2} +$$
$$\ldots + a_{N-2} D^1 + a_{N-1}) = g(D)\hat{Q}(D)$$

As shown in equation 5, if a term "$(D^{N+L}+1)$" is divided by g(D) or a term "$(a_0 D_{N-1} + a_1 D_{N-2} + \ldots + a_{N-2} D_1 + A_{N-1})$" is divided by g(D), although a receiving end performs decoding on a bit stream encoded by a transmitting end using fCRC on the premise of bCRC, the receiving end may succeed in performing CRC check. In particular, an ambiguity problem may occur. In this case, if the term "$(a_0 D_{N-1} + a_1 D_{N-2} + \ldots + a_{N-2} D_1 + A_{N-1})$" is divided by the g(D), it means that $p_0 = p_1 = \ldots = p_{L-2} = p_{L-1} = 0$ is satisfied.

In summary, the ambiguity problem may occur in 3 conditions in total.

Condition 1) when $(D^{N+L}+1)$ is divided by g(D)

Condition 2) when $a_0 = a_1 = \ldots = a_{L-2} = a_{L-1} = 0$ is satisfied. In particular, the L numbers of bits positioned at the fore part of the N number of input bits are all 0s.

Condition 3) when $p_0 = p_1 = \ldots = p_{L-2} = p_{L-1} = 0$ is satisfied. In particular, the L numbers of parity bits are all 0s.

Among the 3 conditions, the condition 2 and the condition 3 correspond to a case that the first L number of bits of a bit stream Y(D) received by the receiving end are all 0s. If the first L number of bits of the received bit stream Y(D) are all 0s, the receiving end is unable to distinguish a case that a part of input bits encoded via the bCRC is 0 according to the condition 2 from a case that all parity bits encoded via the fCRC are 0 according to the condition 3.

In the following, an embodiment for solving an ambiguity problem, which occurs under the aforementioned 3 conditions, is explained.

Method 1) As a solution for the condition 1, if an input bit of which a term "$(D^{N+L}+1)$" is not divided by g(D) is permitted only, the ambiguity problem does not occur. Meanwhile, since a cyclic generator polynomial and the number of parity bits are determined in advance between a transmitting end and a receiving end, L value corresponds to a fixed value. In particular, whether or not the ambiguity problem of the condition 1 occurs is determined according to the number (N) of input bits.

According to the method 1, the scheme proposed in FIGS. 9 and 10 can be applied to the N that a term "$(D^{N+L}+1)$" is not divided by g(D) only. If it is necessary to transmit the N number of bits capable of being divided by the g(D) as input bits, the transmitting end can perform encoding on a bit stream by configuring the K number of bits incapable of being divided by the g(D) (K is a minimum integer greater than N of which $(D^{K+L}+1)$ is not divided by the g(D)). In this case, the (K−N) number of bits added to the N number of bits can be padded with predetermined bits.

Method 2) As a first solution for the condition 2 and the condition 3, the scheme proposed in FIGS. 9 and 10 can be applied to input bits of which all of the first L number of bits are unable to become 0. In particular, when all of the L numbers of bits of input bits are unable to become 0, if the first L number of bits of a received bit stream Y(D) are all 0s, it means that parity bits are all 0s and are encoded by fCRC. If the latter L number of bits of a received bit stream Y(D) are all 0s, it means that parity bits are all 0s and are encoded by bCRC.

According to the method 2, since the first L numbers of bits are not 0 among the N number of input bits, if the first L numbers of bits of a received bit stream are all 0s, a receiving end can recognize that parity bits are all 0s and are encoded by the fCRC. On the contrary, if the latter L numbers of bits of a received bit stream are all 0s, the receiving end can recognize that parity bits are all 0s and are encoded by the bCRC. In particular, an ambiguity problem does not occur.

Method 3) If the first L numbers of bits of a received bit stream are all 0s and parity bits are all 0s, a receiving end can always determine it as the bCRC is applied. In particular, a transmitting end and a receiving end can promise to apply the bCRC only to a case that an ambiguity problem occurs. By doing so, it is able to solve the ambiguity problem without a restriction on input bits. Specifically, if the first L numbers of bits of a received bit stream are all 0s, or the latter L numbers of bits of a received bit stream are all 0s, the receiving end determines it as the bCRC is applied and performs decoding on the bit stream.

Method 4) corresponds to a variation of the method 3. If the first L numbers of bits of a received bit stream are all 0s, or the latter L numbers of bits of a received bit stream are all 0s, the receiving end determines it as the fCRC is applied and may perform decoding on the bit stream.

Meanwhile, among the 4 methods, the method 1 should be applied all the time to solve the condition 1. In order to solve the condition 2 and the condition 3, it is necessary to apply at least one selected from the group consisting of the method 2, the method 3, and the method 4. In particular, the transmitting end and the receiving end performs encoding and decoding on a bit stream by applying at least one selected from the group consisting of the method 2, the method 3, and the method 4 in addition to the method 1.

Figure 13:
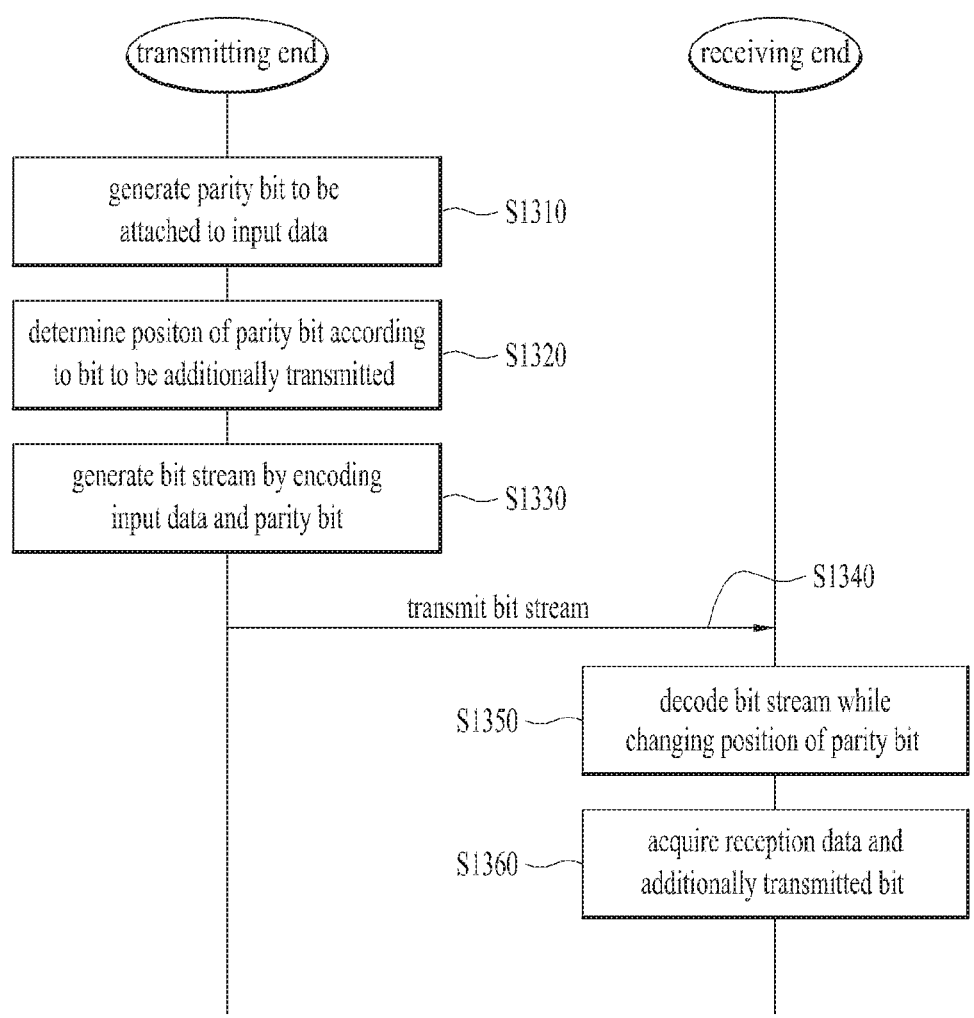
FIG. 13 is a flowchart for a method of transmitting a bit stream and a method of processing a bit stream proposed in the present invention.

FIG. 13 illustrates the aforementioned embodiments according to a time flow. Hence, although it is not depicted or described in FIG. 13, the aforementioned contents can be identically or similarly applied to FIG. 13.

First of all, a transmitting end receives an input data and generates a parity bit to be added to the input data (or, an input bit) [S1310]. In this case, in order to prevent the aforementioned ambiguity problem, the proposed embodiment can be applied to input bits satisfying the method 1 and/or the method 2 only. The proposed embodiment can be applied to an input bit satisfying the method 1 or an input bit satisfying both the method 1 and the method 2 at the same time. If an input bit satisfies the method 1 only, it is necessary to consider a method 3 or a method 4 described in the following to solve the ambiguity problem.

Subsequently, the transmitting end determines a position of a parity bit according to a bit to be additionally transmitted in addition to the input data [S1320]. A parity bit can be attached to the front or the back of the input bit depending on whether information of 1 bit to be additionally transmitted indicates '0' or V. For example, if the information to be additionally transmitted indicates '0', a parity bit can be attached to the back of the input bit (the bCRC). If the information to be additionally transmitted indicates '1', a parity bit can be attached to the front of the input bit (the fCRC).

Subsequently, the transmitting end generates a bit stream by performing encoding on both the input data and the parity bit [S1330]. The encoding procedure can be comprehended as a procedure of performing encoding by attaching a parity bit to the front or the back of the input bit according to the position of the parity bit determined in the step S1320.

The transmitting end transmits the bit stream to the receiving end [S1340] and the receiving end performs decoding on the bit stream. Since the receiving end is unable to know information on whether the parity bit is attached to the front or the back of the input bit, the receiving end performs decoding on the bit stream while changing a position of the parity bit [S1350]. The receiving end is able to know a CRC attached to the input bit among the bCRC and the fCRC via the decoding. In particular, the receiving end is able to know whether the additional information transmitted by the transmitting end together with the input bit indicates '0' or '1' [S1360].

Meanwhile, if the receiving end succeeds in decoding both the bCRC and the fCRC, the receiving end is unable to know whether the additional information indicates '0' or '1'. In particular, an ambiguity problem may occur. In this case, the receiving end assumes that one of the bCRC and the FCRC is applied by applying the method 3 or the method 4 and completes decoding.

Meanwhile, a base station can inform a UE of the conditions and the methods constructing the proposed embodiment. And, the base station may indicate the UE to apply the aforementioned embodiment via physical layer signaling or higher layer signaling.

In FIGS. 9 to 13, a procedure of transmitting information corresponding to additional 1 bit by attaching a parity bit to the front or the back of an input bit has been explained. This embodiment can be extended to transmit information corresponding to additional n bits.

For example, if it is able to attach a parity bit to the back of a kth bit from an input bit, a transmitting end can forward additional information corresponding to maximum 2 bits according to the change of K changing from 1 to 4. Similarly, this embodiment can be applied to an input bit satisfying a specific condition for preventing an ambiguity problem only. The ambiguity problem occurs when CRC check succeeds in a plurality of positions. A method for a receiving end to process the ambiguity problem can be determined in advance. Although the abovementioned schemes are applied, if an ambiguity problem occurs, the receiving end regards an input bit as invalid and discards a received bit stream. Or, the receiving end may recognize the input bit as a predefined value.

In the following, an example of applying the aforementioned embodiments to LTE/LTE-A system is explained.

First of all, the aforementioned embodiments can be applied when a transmitting end corresponds to a base station, a receiving end corresponds to a user equipment, and an input bit corresponds to a DCI (downlink control indicator). In this case, a size of the DCI can be restricted to N bits satisfying the condition mentioned earlier in the method 1. And, a legacy LTE system uses 16-bit CRC (except DCI format 3/3A) and a resource allocation field is included in the first 16 bits of the DCI. In case of a resource allocation type 0 or 1, since whether or not a resource is allocated is expressed in a bitmap form, it is very rare to transmit the resource allocation field set to all 0s. If a DCI indicates resource allocation using the resource type 0 or 1, since the condition 2 is satisfied, the aforementioned embodiment can be applied. In case of a resource type 2, if the resource allocation field is set to all 0s, it means that one $N_{RB}^{step}$ is allocated only from a PRB (physical resource block). Hence, if an operation of allocating one $N_{RB}^{step}$ is restricted in the resource allocation type 2, although all input bits are 0, a receiving end can perform decoding on input bits transmitted by a transmitting end without an ambiguity problem. In the aforementioned various situations, a transmitting end can transmit additional information to a receiving end by utilizing a position of a parity bit attached to a DCI. Compared to a legacy scheme that RNTI is additionally allocated to a specific UE and additional information is transmitted by differentiating a CRC mask according to the RNTI, a method according to the proposed embodiment has a merit in that it is able to transmit additional information to a specific UE without allocating RNTI.

As a different example, the aforementioned embodiments can also be applied when a transmitting end corresponds to a user equipment, a receiving end corresponds to a base station, and an input bit corresponds to a UCI (uplink control indicator). Specifically, when the user equipment transmits UCI via PUCCH or transmits UCI (HARQ ACK/NACK, RI, PMI, CQI, etc.) via PUSCH through piggyback, the aforementioned embodiments can be applied. The user equipment may set a limit on a size of the UCI by the N bits according to the condition mentioned earlier in the method 1. In order to solve an ambiguity problem, if the first L numbers of bits of a bit stream are set to 0, the user equipment can abandon a scheme of attaching a parity bit. In a process of transmitting HARQ ACK/NACK, if an ambiguity problem occurs despite the application of the proposed embodiment, the receiving end may discard received information or assume that the receiving end has received HARQ NACK.

Those skilled in the art will appreciate that the proposed embodiment is applied not only to the aforementioned examples but also to various transmission and reception processes. The abovementioned embodiments can be implemented independently or in a manner of combining or aggregating two or more schemes described in the present specification.

4. Apparatus Configuration

Figure 14:
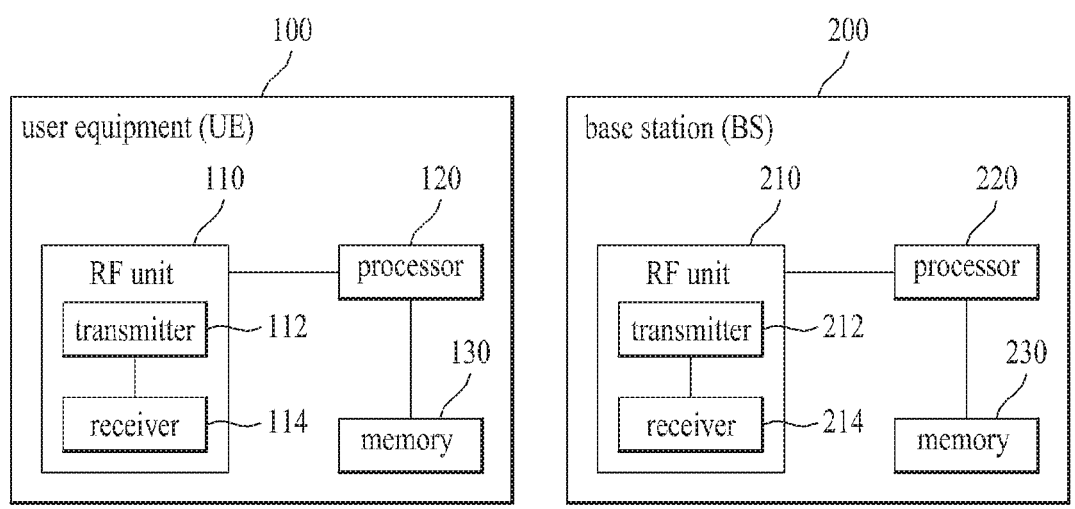
FIG. 14 is a block diagram for configurations of a user equipment and a base station according to one embodiment of the present invention.

FIG. 14 describes a structure of a UE and a BS according to an embodiment of the present invention. Referring to FIG. 14, a UE 100 and a BS 200 may respectively include radio frequency (RF) units 110 and 210, processors 120 and 220 and memories 130 and 230. While FIG. 14 shows one-to-one communication between the UE 100 and the BS 200, communication between a plurality of UEs and a plurality of BSs may be performed. And, the BS 200 shown in FIG. 14 can be applied to both a macro cell BS and a small cell BS.

The RF units 110 and 210 may respectively include transmitters 112 and 212 and receivers 114 and 214. The transmitter 112 and the receiver 114 of the UE 100 may be configured to transmit/receive signals to/from the BS 200 and other UEs. The processor 120 of the UE 100 may be functionally connected to the transmitter 112 and the receiver 114 to control the transmitter 112 and the receiver 114 to transmit/receive signals to/from other devices. In addition, the processor 120 may process signals to be transmitted, transmit the processed signals to the transmitter 112 and process signals received by the receiver 114.

The processor 120 may store information included in an exchanged message in the memory 130 as necessary. The UE 100 having the aforementioned configuration may perform the aforementioned methods according to embodiments of the present invention.

The transmitter 212 and the receiver 214 of the BS 200 may be configured to transmit/receive signals to/from other BSs and UEs. The processor 220 of the BS 200 may be functionally connected to the transmitter 212 and the receiver 214 to control the transmitter 212 and the receiver 214 to transmit/receive signals to/from other devices. In addition, the processor 220 may process signals to be transmitted, transmit the processed signals to the transmitter 212 and process signals received by the receiver 214. The processor 220 may store information included in an exchanged message in the memory 230 as necessary. The BS 200 having the aforementioned configuration may perform the aforementioned methods according to embodiments of the present invention.

The processors 120 and 220 of the UE 100 and the BS 200 control (e.g. adjust and manage) operations of the UE 100 and the BS 200. The processors 120 and 220 may be respectively connected to the memories 130 and 230 for storing program code and data. The memories 130 and 2130 are respectively connected to the processors 120 and 220 and store operating systems, applications and general files.

The processors 120 and 220 may be called controllers, microcontrollers, microprocessors, microcomputers or the like. The processors 120 and 220 may be implemented using hardware, firmware, software or a combination thereof.

When embodiments of the present invention are implemented using hardware, application specific integrated circuits (ASICs), digital signal processors (DSPs), digital signal processing devices (DSPDs), programmable logic devices (PLDs), field programmable gate arrays (FPGAs), etc., which are configured to perform the present invention, may be included in the processors 120 and 220.

The aforementioned method may be implemented as programs executable in computers and executed in general computers that operate the programs using computer readable media. In addition, data used in the aforementioned method may be recorded in computer readable recording media through various means. It should be understood that program storage devices including computer code executable to perform various methods of the present invention do not include temporary objects such as carrier waves or signals. The computer readable media include storage media such as magnetic recording media (e.g. ROM, floppy disk and hard disk) and optical reading media (e.g. CD-ROM and DVD).

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

INDUSTRIAL APPLICABILITY

The method of transmitting and processing a bit stream is applicable to various wireless communication systems including a 3GPP system, and/or a 3GPP2 system. Moreover, the proposed method can also be applied to mmWave communication system using an ultra-high frequency band.

What is claimed is:

1. A method of transmitting a bit stream, which is transmitted by a transmitting end to a receiving end in a wireless communication system, the method comprising:
receiving input bits for data to be transmitted to the receiving end;
determining a position of parity bits to be attached to the input bits according to a value indicated by additional information to be transmitted to the receiving end together with the data;
encoding the input bits and the parity bits according to the determined position; and
transmitting the bit stream generated by being encoded to the receiving end,
wherein a number of the input bits is N,
wherein the N number of the input bits satisfies a condition that $(D^{N+L}+1)$ is not divided by g(D), wherein the g(D) corresponds to a cyclic generator polynomial for the parity bits, wherein $D^{N+L}$ corresponds to a polynomial component of Galois field (GF) (2), and wherein L corresponds to the number of the parity bits, and
wherein when the N number of the input bits does not satisfy the condition, the encoding comprises performing encoding by padding a predetermined bits to the input bits.

2. The method of claim 1, wherein when the value indicated by the additional information corresponds to 0, the determined position is the back of the input bits, and
wherein when the value indicated by the additional information corresponds to 1, the determined position is the front of the input bits.

3. The method of claim 1, wherein the transmitting end corresponds to a base station, wherein the receiving end corresponds to a user equipment, and wherein the data corresponds to a resource allocation field of a DCI (downlink control indicator).

4. The method of claim 1, wherein the transmitting end corresponds to a user equipment, wherein the receiving end corresponds to a base station, and wherein the data corresponds to a UCI (uplink control indicator).

5. A transmitting end transmitting a bit stream to a receiving end in a wireless communication system, comprising:
a transmitter;
a receiver; and
a processor configured to operate in a manner of being connected with the transmitter and the receiver,
wherein the processor receives input bits for data to be transmitted to the receiving end, determines a position of parity bits to be attached to the input bits according to a value indicated by additional information to be transmitted to the receiving end together with the data, encodes the input bits and the parity bits according to the determined position, and transmits a bit stream generated by being encoded to the receiving end,
wherein a number of the input bits is N,
wherein the N number of the input bits satisfies a condition that $(D^{N+L}+1)$ is not divided by g(D), wherein the g(D) corresponds to a cyclic generator polynomial for the parity bits, wherein $D^{N+L}$ corresponds to a polynomial component of Galois field (GF) (2), and wherein L corresponds to the number of the parity bits, and
wherein when the N number of the input bits does not satisfy the condition, the encoding comprises performing encoding by padding a predetermined bits to the input bits.

* * * * *